United States Patent
Huang et al.

(10) Patent No.: US 12,500,410 B2
(45) Date of Patent: Dec. 16, 2025

(54) DRIVING CIRCUIT

(71) Applicant: Vanguard International Semiconductor Corporation, Hsinchu (TW)

(72) Inventors: Shao-Chang Huang, Hsinchu (TW); Ching-Ho Li, Hsinchu (TW); Chun-Chih Chen, New Taipei (TW); Kai-Chieh Hsu, Taoyuan (TW); Chien-Wei Wang, Taoyuan (TW); Chih-Hsuan Lin, Hsinchu (TW); Hwa-Chyi Chiou, Hsinchu (TW); Gong-Kai Lin, Luodong Township (TW); Li-Fan Chen, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 482 days.

(21) Appl. No.: 18/147,152

(22) Filed: Dec. 28, 2022

(65) Prior Publication Data
US 2024/0222965 A1 Jul. 4, 2024

(51) Int. Cl.
H02H 9/04 (2006.01)
H10D 89/60 (2025.01)

(52) U.S. Cl.
CPC ........... *H02H 9/046* (2013.01); *H10D 89/611* (2025.01); *H10D 89/811* (2025.01)

(58) Field of Classification Search
CPC .... H02H 9/046; H10D 89/611; H10D 89/811; H10D 89/819

(Continued)

(56) References Cited

U.S. PATENT DOCUMENTS 10,867,989 B2  12/2020  Lin et al.
2022/0238509 A1  7/2022  Lee

FOREIGN PATENT DOCUMENTS

CN  102243262 A  11/2011
CN  110635797 A  12/2019
CN  114825303 A  7/2022

OTHER PUBLICATIONS

Mari(On-Chip Electrostatic Discharge Protection for ICs EE Power article Jan. 29, 2021) (Year: 2021).*

(Continued)

*Primary Examiner* — Arnold M Kinkead
(74) *Attorney, Agent, or Firm* — Birch, Stewart, Kolasch & Birch, LLP (57) ABSTRACT

A driving circuit includes a detection circuit, a control circuit, and a power device. The detection circuit is coupled between first and second power terminals. The detection circuit generates a detection voltage at a detection node based on a first voltage of the first power terminal and a second voltage of the second power terminal. The control circuit includes a transistor device with a back-to-back connection structure that is coupled between a bonding pad and a first node and controlled by the detection voltage to generate a driving voltage at the first node for controlling the power device. In response to an electrostatic discharge event occurring on the bonding pad, the transistor device is turned on according to the detection voltage, and the power device is triggered by the driving voltage to provide a discharge path between the bonding pad and the second power terminal.

20 Claims, 7 Drawing Sheets (58) Field of Classification Search
USPC .......... 327/50, 54, 58, 80, 81; 307/23; 361/6
See application file for complete search history.

(56) References Cited

OTHER PUBLICATIONS

Wang NPL (Wiley IEEE Press 1st Ed, 2021) (Year: 2021).*
Mari NPL (Year: 2021).*
Taiwanese Office Action and Search Report for Taiwanese Application No. 111143933, dated Nov. 30, 2023.

* cited by examiner

DRIVING CIRCUIT

BACKGROUND OF THE INVENTION

Field of the Invention

The present invention relates to a driving circuit, and more particularly, to a driving circuit with electrostatic discharge protection.

Description of the Related Art

As the process of manufacturing integrated circuits has developed, the size of semiconductor components has been reduced to the sub-micron level to improve the performance and operation speed of the integrated circuits. However, this reduction of the size of components has caused some reliability problems. This is particularly true for integrated circuits, in which protection against electrostatic discharge (ESD) is seriously affected. Therefore, it is important to provide a circuit that can provide an electrostatic discharge path. Especially, in high voltage applications, components used to control electrostatic discharge paths can be damaged by high voltages, resulting in a failure to effectively provide a discharge path when an electrostatic discharge event occurs.

BRIEF SUMMARY OF THE INVENTION

An exemplary embodiment of the present invention provides a driving circuit. The driving circuit comprises a detection circuit, a control circuit, and a power device. The detection circuit is coupled between a first power terminal and a second power terminal. The detection circuit generates a detection voltage at a detection node based on a first voltage of the first power terminal and a second voltage of the second power terminal. The control circuit comprises a transistor device with a back-to-back connection structure. The transistor device is coupled between a bonding pad and a first node and controlled by the detection voltage. A driving voltage is generated at the first node. The power device is coupled between the bonding pad and the second power terminal and controlled by the driving voltage. In response to an electrostatic discharge event occurring on the bonding pad, the transistor device is turned on according to the detection voltage, and the power device is triggered by the driving voltage to provide a discharge path between the bonding pad and the second power terminal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
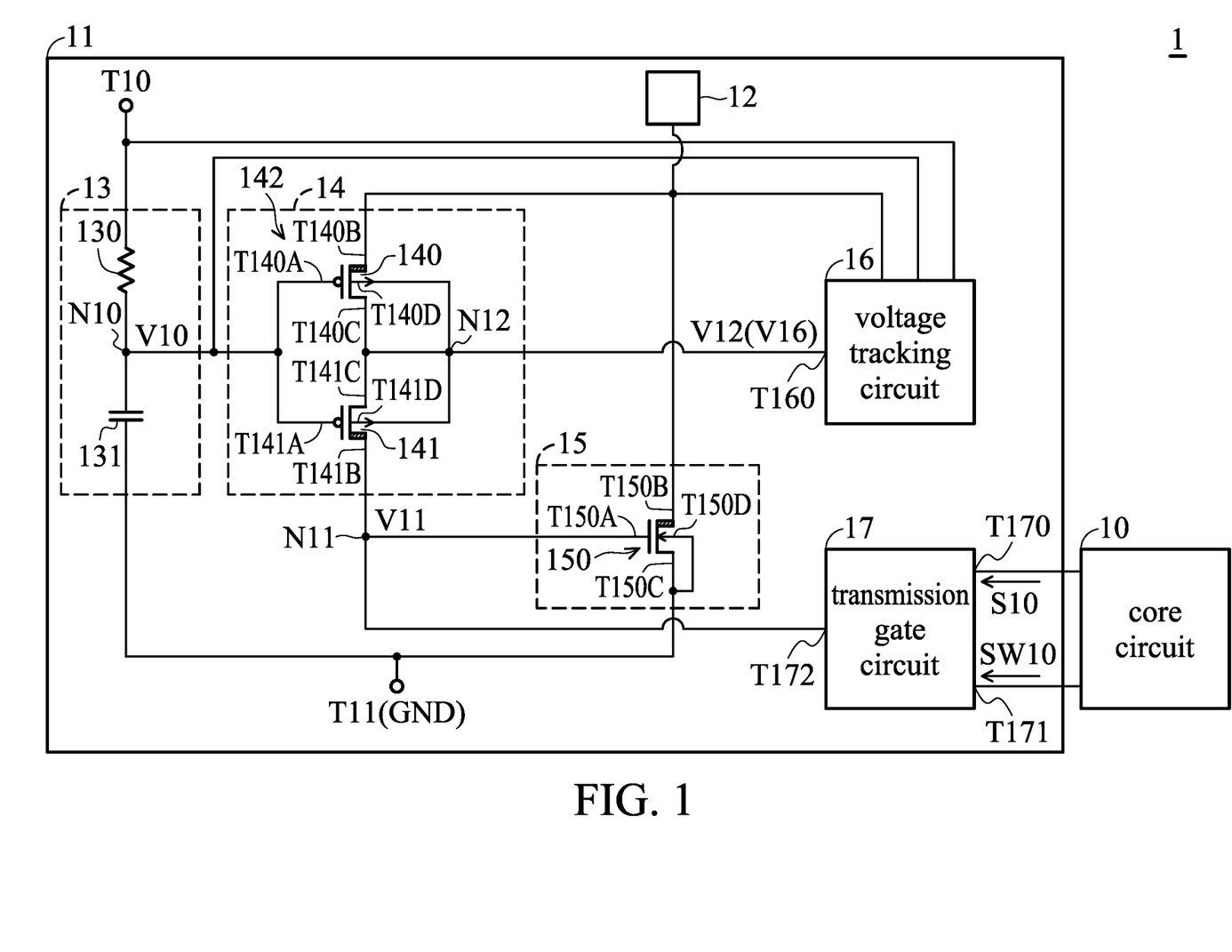
FIG. 1 shows an electronic circuit comprising a driver circuit according to one embodiment of the present invention.

FIG. 1 shows an electronic circuit according to one embodiment of the present invention. Referring to FIG. 1, an electronic circuit 1 comprises a core circuit 10 and a driving circuit 11. The driving circuit 11 comprises a bonding pad 12, a detection circuit 13, a control circuit 14, a power device 15, a voltage tracking circuit 16, and a transmission gate circuit 17. The power device 15 is coupled between the bonding pad 12 and a power terminal T11. In the embodiment, the power device 15 serves as the output stage of the driving circuit 11 and is driven by a large current. The power device 15 can withstand a large current and, thus, has a self-protection capability for electrostatic discharge. In the embodiment, the power device 15 is implemented by a large array device (LAD). For example, the power device 15 comprises a plurality of N-type metal-oxide-semiconductor (NMOS) transistors connected in parallel. In FIG. 1, an NMOS transistor 150 is an equivalent element of these NMOS transistors connected in parallel. The NMOS transistor 150 has four terminals, comprises a gate, a drain, a source, and a bulk. In the embodiment, the NMOS transistor 150 is a laterally-diffused N-type metal-oxide semiconductor (LDNMOS) transistor. Referring to FIG. 1, the gate T150A of the NMOS transistor 150 is coupled to the node N11, the drain T150B thereof is coupled to the bonding pad 12, and the source T150C and the bulk T150D thereof are coupled to the power terminal T11. When an electrostatic discharge event occurs on the bonding pad 12, the NMOS transistor 150 is triggered by a driving voltage V11 generated at the node N11 to provide a discharge path between the bonding pad 12 and the power terminal T11. In the embodiment, the power terminal T11 is a ground terminal (GND), and its voltage is, for example, 0 volts (V).

The detection circuit 13 is coupled between a power terminal T10 and the power terminal T11 and generates a detection voltage V10 according to the voltage of the power terminal T10 and the voltage of the power terminal T11. Referring to FIG. 1, the detection circuit 13 comprises a resistor 130 and a capacitor 131. The resistor 130 is coupled between the power terminal T10 and a detection node N10. The capacitor 131 is coupled between the detection node N10 and the power terminal T11. The detection voltage V10 is generated at the detection node N10.

The control circuit 14 comprises a transistor device 142 having a back-to-back connection structure. The transistor device 142 is coupled between the bonding pad 12 and the node N11 and controlled by the detection voltage V10. The transistor device 142 has a first electrode terminal coupled to the bonding pad 12, a second electrode terminal coupled to the node N11, and a control electrode terminal coupled to the detection node N10 to receive the detection voltage V10. Referring to FIG. 1, the transistor device 142 is composed of P-type metal-oxide-semiconductor (PMOS) transistors 140 and 141. Each of the PMOS transistors 140 and 141 has four terminals, comprising a gate, a drain, a source, and a bulk. In the embodiment, the PMOS transistors 140 and 141 are implemented by laterally-diffused P-type metal-oxide semiconductor (LDPMOS) transistors. The gate T140A of the PMOS transistor 140 is coupled to the control electrode terminal of the transistor device 142 (that is, the gate T140A is coupled to the detection node N10), and the drain T140B thereof is coupled to the first electrode terminal of the transistor device 142 (that is, the drain T140B is coupled to the bonding pad 12), and the source T140C and the bulk T140D thereof are coupled to a common source node N12. The gate T141A of the PMOS transistor 141 is coupled to the control electrode terminal of the transistor device 142 (that is, the gate T141A is coupled to the detection node N10), the drain T141B thereof is coupled to the second electrode terminal of the transistor device 142 (that is, the drain T141B is coupled to the node N11), and the source T141C and the bulk T141D there of are coupled to the common source node N12. According to the above connection relationship, the connection between the PMOS transistors 140 and 141 forms a back-to-back connection structure.

As shown in FIG. 1, the voltage tracking circuit 16 is coupled to the power terminal T10 and the bonding pad 12 and controlled by the detection voltage V10. The voltage tracking circuit 16 operates to track one of the voltage of the power terminal T10 and the voltage of the bonding pad 12 to generate a tracking voltage V16 and apply the tracking voltage V16 to the common source node N12 of the transistor device 142 as a bias voltage V12. In details, the voltage tracking circuit 16 tracks the one with higher voltage level: the voltage of the power terminal T10 or the voltage of the bonding pad 12 and generates the tracking voltage V16 (serving as the bias voltage V12) that is equal to the voltage having the higher level.

The transmission gate circuit 17 comprises input terminals T170 and T171 and an output terminal T171. The input terminals T170 and T171 are coupled to the core circuit 10, and the output terminal T172 is coupled to the node N11. When the electronic circuit 1 operates normally, the core circuit 10 provides an input signal S10 to the input terminal T170 and further provides a switching signal SW10 to the input terminal T171. The transmission gate circuit 17 is controlled by the switching signal SW10 to transmit the input signal S10 from the input terminal T170 to the output terminal T172. The input signal S10 is provided to the node N11. That is, the level of the driving voltage V11 generated at the node N11 varies with the voltage level of the input signal S10. In the embodiment, the voltage levels of the input signal S10 and the switching signal SW10 are within a range of 0V-5V.

The detailed operation of the driving circuit 11 will be described by referring to FIGS. 2A and 2B and the following paragraphs.

According to the above description, the PMOS transistors 140 and 141 and the NMOS transistor 150 are LDMOS transistors. The gate-source withstand voltage of a LDMOS transistor is 5V, and the gate-drain withstand voltage of a LDMOS transistor is 12V, 24V, or 40V. In the following embodiments, LDMOS transistors with the gate-source withstand voltage of 5V and the gate-drain withstand voltage of 40V are taken as an example to implement the transistors 140, 141, and 150.

Figure 2A:
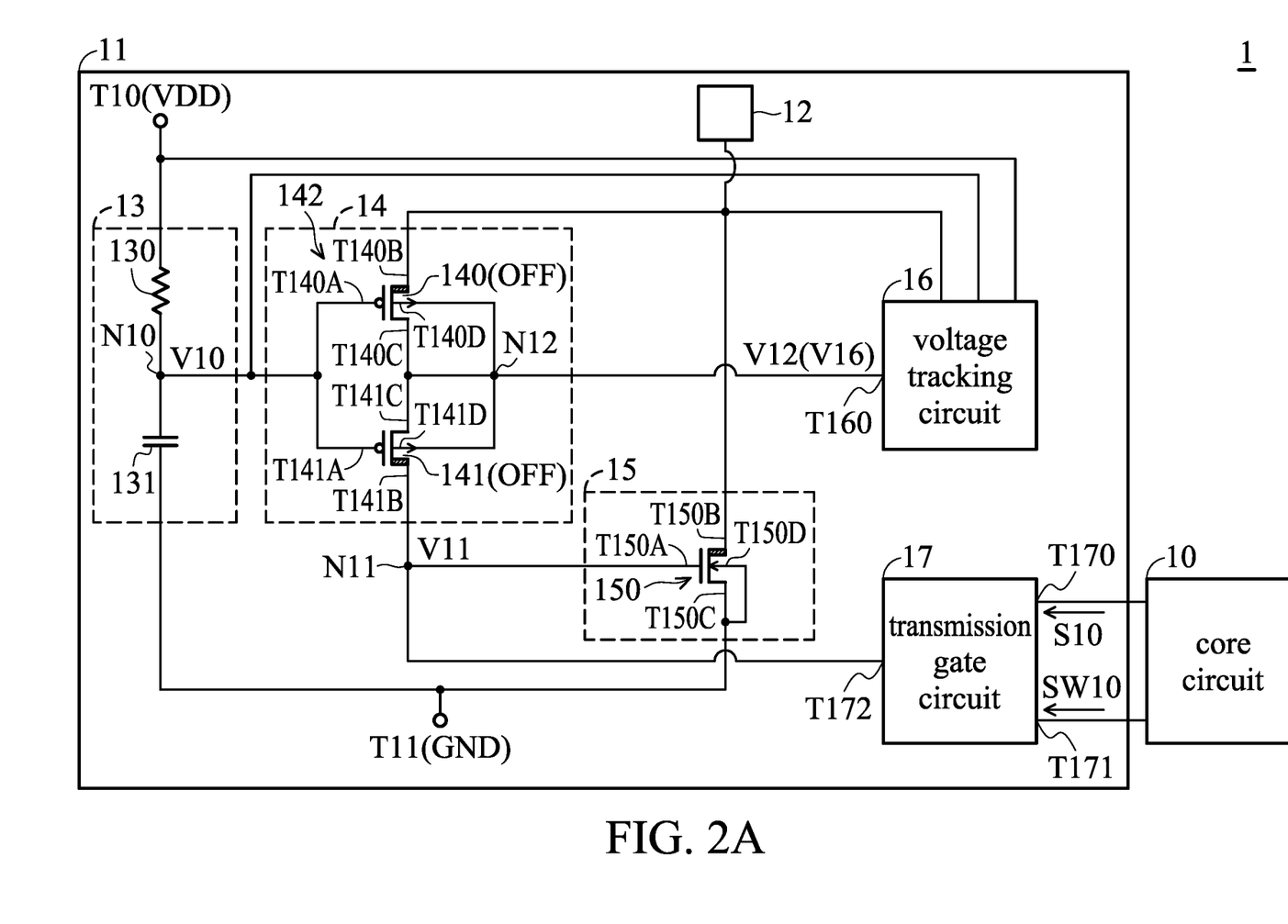
FIG. 2A is a schematic diagram showing a normal operation of the electronic circuit of FIG. 1.

Referring to FIG. 2A, when the electronic circuit 1 is operating normally (that is, the electronic circuit 1 is in an operation mode), the power terminal T10 receives an operation voltage VDD, the core circuit 10 provides the input signal S10 and the switching signal SW10 to the transmission gate circuit 17, and the voltage of the bonding pad 12 changes within a range. In the embodiment, the operation voltage VDD is, for example, 44V, and the voltage of the bonding pad 12 is within a range of 0V-44V, however, the present invention is not limited thereto, and those skilled in the art can determine the above voltage and range according to the actual applications. The operation voltage VDD charges the capacitor 131 through the resistor 130 so that the detection voltage V10 on the detection node N10 has a high level, such as 44V. According to the above description, the voltage tracking circuit 16 tracks the one with a higher level among the voltage of the power terminal T10 and the voltage of the bonding pad 12. Since the operation voltage VDD (44V) received by the power terminal T10 is higher than or equal to the voltage of the bonding pad 12 (0V-44V), the voltage tracking circuit 16 tracks the operation voltage VDD and generates the tracking voltage V16 of 44V. The tracking voltage V16 of 44V is applied to the common source node N12 as the bias voltage V12 (44V). Since the detection voltage V10 is 44V and the voltage at the common source node N12 is 44V, the PMOS transistors 140 and 141 are turned off (OFF). The transmission gate circuit 17 performs a signal transmission operation according to the switching signal SW10. In details, the transmission gate circuit 17 transmits the input signal S10 to the output terminal T172 according to the switching signal SW10, and the input signal S10 is then provided to the node N11. At this time, since the PMOS transistors 140 and 141 are turned off, the level of the driving voltage V11 at the node N11 changes according to the voltage level (0V-5V) of the input signal S10. The NMOS transistor 150 operates according to the driving voltage V11 and the voltage of the bonding pad 12 to be in a turned-on or turned-off state.

According to the above description, the PMOS transistors 140 and 141 form the transistor device 142. For the transistor device 142, the terminal coupled to the bonding pad 12 is the drain T140B of the PMOS transistor 140, and the terminal coupled to the node N11 is the drain T141B of the PMOS transistor 141. Therefore, both of the above-mentioned terminals of the transistor device 142 can withstand high voltages. For example, when the NMOS transistor 150 is turned on according to the driving voltage V11 and the voltage of the bonding pad 12, the drain T140B of the PMOS transistor 140 is coupled to the power terminal T11, and the voltage of the drain T140B is on a low level, such as a level of 0V. In this case, the gate-drain voltage difference of the PMOS transistor 140 is approximately equal to 44V (44V-0V=44V), which does not exceed the gate-drain withstand voltage of 44V. When the driving voltage V11 is equal to 0V according to the voltage level of the input signal S10, the gate-drain voltage difference of the PMOS transistor 141 is approximately equal to 44V (44V-0V=44V), which does not exceed the gate-drain withstand voltage of 44V. According to the above description, the transistor device 142 is coupled to the bonding pad 12 and the node N11 through the drains T140B and T141B of the PMOS transistors 140 and 141 respectively. Thus, the transistor device 142 can withstand high voltages.

Figure 2B:
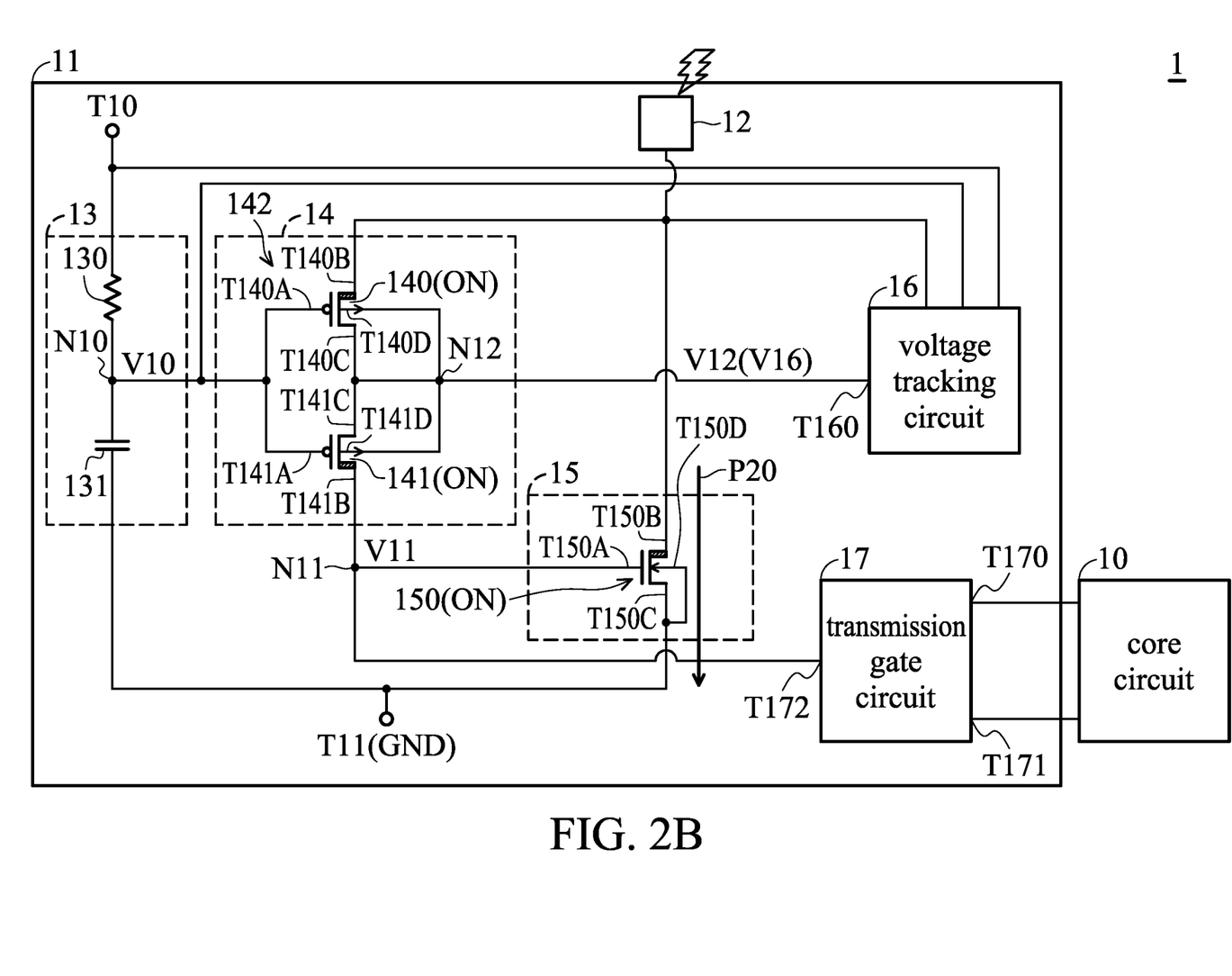
FIG. 2B is a schematic diagram showing an operation of the electronic circuit of FIG. 1 when an electrostatic discharge event occurs.

Referring to FIG. 2B, when the electronic circuit 1 is not in the operation mode, the operation voltage VDD is not provided to the power terminal T10, and the core circuit 10 does not provide the input signal S10 and the switching signal SW10. At this time, the power terminal T10 and the input terminals T170 and T171 and the output terminal T172 of the transmission gate circuit 17 are in a floating state. The transmission gate circuit 17 does not perform the signal transmission operation. When an electrostatic discharge event occurs on the bonding pad 12 of the electronic circuit 1, the voltage of the bonding pad 12 increases instantaneously. Based on the characteristics of the capacitor 131, the detection voltage V10 at the detection node N10 is the same as the voltage of the power terminal T11, that is, the detection voltage V10 is 0V. The voltage of the power terminal T10 that is in the floating state is lower than the high voltage of the bonding pad 12. Thus, the voltage tracking circuit 16 tracks the high voltage of the bonding pad 12, and the generated tracking voltage V16 is equal to the high voltage of the bonding pad 12. The tracking voltage V16 is applied to the common source node N12 as the bias voltage V12. Since the detection voltage V10 is 0V and the common source node N12 has the high voltage, the PMOS transistors 140 and 141 are turned on (ON). The driving voltage V11 at the node N11 increases as the change in the voltage of the bonding pad 12 to turn on (ON) the NMOS transistor 15. The turned-on NMOS transistor 15 provides a discharge path P20. The electrostatic charges on the bonding pad 12 are conducted to the power terminal T11 through the NMOS transistor 15 and along the discharge path P20.

According to the above description, the two terminals of the transistor device 142 that are coupled to the bonding pad 12 and the node N11 are the drains T140B and T141B of the PMOS transistors 140 and 141 respectively. Thus, the transistor device 142 can withstand high voltages. In the operation mode of the electronic circuit 1, the transistor device 142 is not easily damaged by the driving voltage V11 and the voltage of the bonding pad 12. In addition, in the operation mode of the electronic circuit 1, the transistor device 142 is in the turned-off state. Therefore, the configuration of the transistor device 142 is not affect the normal operation of the power device 15. When an electrostatic discharge event occurs on the bonding pad 12 of the electronic circuit 1, the transistor device 142 controls the power device 15 to turn on to provide a discharge path so that the electrostatic charges are conducted to the power terminal T11 through the power device 15.

Figure 3:
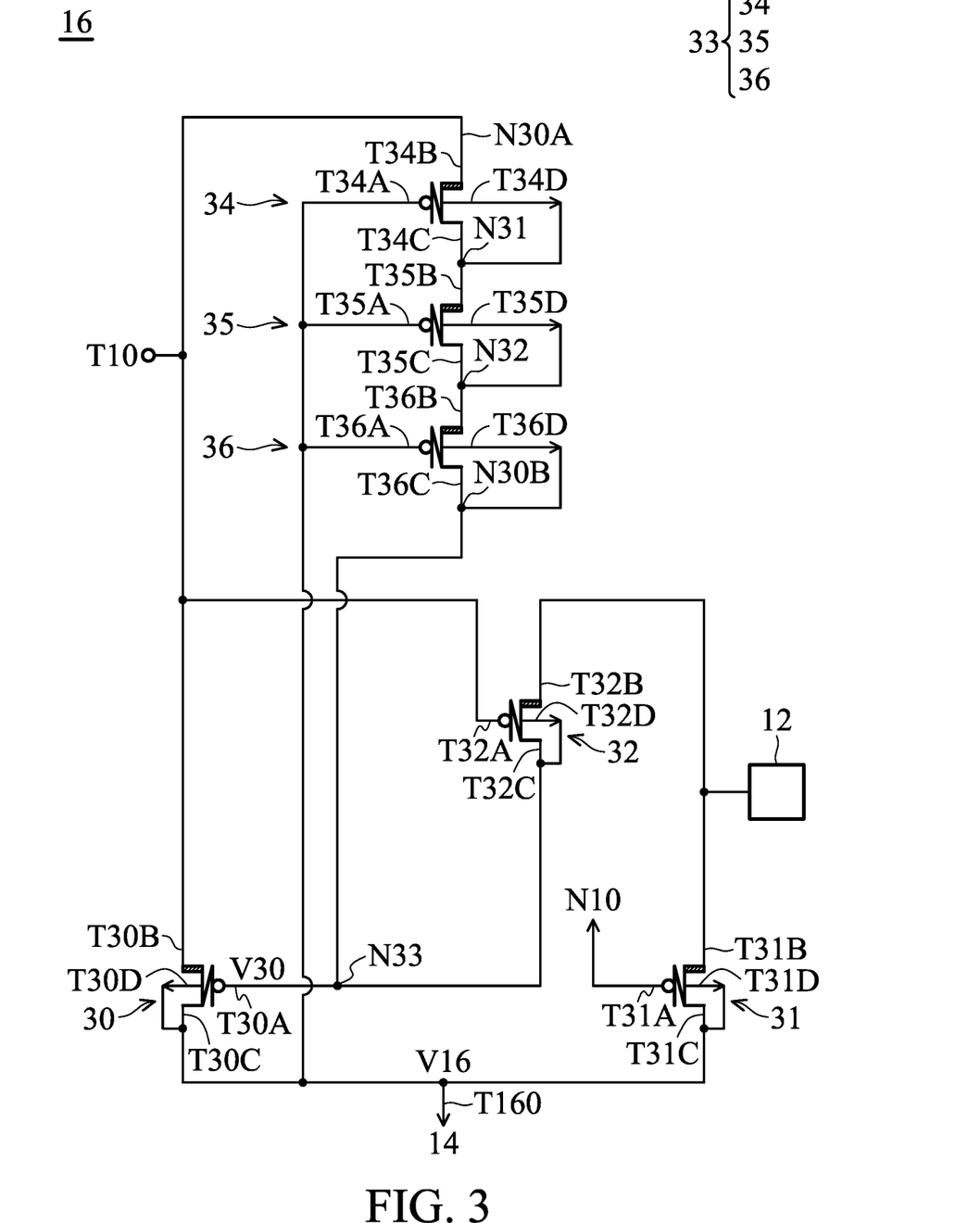
FIG. 3 is schematic diagram showing a voltage tracking circuit of the driving circuit in FIG. 1 according to an embodiment of the present invention.

FIG. 3 is schematic diagram showing the voltage tracking circuit 16 of the driving circuit 11. The voltage tracking circuit 16 comprises PMOS transistors 30-32 and a voltage-reducing circuit 33. In this embodiment, the PMOS transistors 30-32 are realized by LDPMOS transistors. The PMOS transistor 30 comprises four electrode terminals T30A-T30D, which are a gate T30A, a drain T30B, a source T30C, and a bulk T30D. The drain T30B is coupled to the power terminal T10, and the source T30C and the bulk T30D are coupled to an output terminal T160. The voltage-reducing circuit 33 has an input node N30A and an output node N30B. The input node N30A is coupled to the power terminal T10, and the output node N30B is coupled to a node N33 and the gate T30A of the PMOS transistor 30. Referring to FIG. 3, the output node N30B and the node N33 can be regarded as the same node. The PMOS transistor 31 comprises four electrode terminals T31A-T31D, which are a gate T31A, a drain T31B, a source T31 and a bulk T31D respectively. The gate T31A is coupled to the node N10, the drain T31B is coupled to the bonding pad 12, and the source T31C and the bulk T31D are coupled to the output terminal T160. The PMOS transistor 32 comprises four electrode terminals T32A-T32D, which are a gate T32A, a drain T32B, a source T32C, and a bulk T32D. The gate T32A is coupled to the power terminal T10, the drain T32B is coupled to the bonding pad 12, and the source T32C and the bulk T32D are coupled to the node N33.

The voltage-reducing circuit 33 comprises a plurality of voltage-reducing elements connected in series between the input node N30A and the output node N30B, thereby achieving a voltage-reducing operation. The actual number of voltage-reducing elements can be adjusted according to the actual requirements for a modulation voltage, and the present invention does not intent to limit the number of voltage-reducing elements. Referring to FIG. 3, in the embodiment, the voltage-reducing circuit 33 comprises three PMOS transistors 34-36 connected in series between the input node N30A and the output node N30B as the voltage-reducing elements. The PMOS transistors 34-36 are implemented by LDPMOS transistors. The PMOS transistor 34 has four electrode terminals T34-T34D, which are a gate T34A, a drain T34B, a source T34C, and a bulk T34D respectively. The drain T34B is coupled to the input node N30A, and the source T34C and the bulk T34D are coupled to a node N31. The PMOS transistor 35 has four electrode terminals T35A-T35D, which are a gate T35A, a drain T35B, a source T35C, and a bulk T35D respectively. The drain T35B is coupled to the node N31, and the source T35C and the bulk T35D are coupled to a node N32. The PMOS transistor 36 has four electrode terminals T36A-T36D, which are a gate T36A, a drain T36B, a source T36C, and a bulk T36D. The drain T36B is coupled to the node N32, and the source T36C and the bulk T36D are coupled to the output node N30B and the node N33. All the gates T34A, T35A, and T36A of the PMOS transistors 34-36 are coupled to the output terminal T160.

In the embodiment, LDMOS transistors with the gate-source withstand voltage of 5V and the gate-drain withstand voltage of 40V are taken as an example to implement the transistors 30-32 and 34-36. The operation of the voltage tracking circuit 16 is explained as the following paragraphs.

When the electronic circuit 1 operates normally (that is, the electronic circuit 1 is in the operation mode), the voltage tracking circuit 16 receives the operation voltage VDD (44V) through the power terminal T10, the detection voltage V10 at the detection node N10 is 44V according to the operation voltage VDD, and the voltage of the bonding pad 12 is within the range of 0V-44V. Therefore, the PMOS transistors 31 and 32 are turned off. At this time, the PMOS transistors 34-36 are in the turned-off state. Since there are parasitic diodes in the PMOS transistors 34-36, the turned-off PMOS transistors 34-36 serve as forward diodes. Each of the PMOS transistors 34-36 provides a cross-voltage of about 0.7V between the respective drain and source. Therefore, the voltage difference between the input node N30A and the output node N30B is about 2.1V (0.7V×3=2.1V). The voltage difference (2.1V) between the input node N30A and the output node N30B is used as the modulation voltage provided by the voltage-reducing circuit 33. A control voltage V30 generated at the output node N30B is equal to 41.9V (44V-2.1V=41.9V), thereby achieving the voltage-reducing operation. That is, the operation voltage VDD is reduced by the amount of the modulation voltage, and, thus, the control voltage V30 is generated at the output node N30B after the reduction. At this time, the voltage of the gate T30A of the PMOS transistor 30 is equal to the control voltage V30. Since the control voltage V30 is smaller than the operation voltage VDD, the PMOS transistor 30 is turned on to provide a current path between the power terminal T10 and the output terminal T160. Through this current path, the tracking voltage V16 of the output terminal T160 increases following the operation voltage VDD and finally becomes equal to the operation voltage VDD (V16=VDD=44V), thereby achieving that the voltage tracking circuit 16 tracks a voltage with a higher level (that is, the operation voltage VDD of the terminal T10).

In the operation mode, since the tracking voltage V16 of the output terminal T160 follows the one with higher level among the voltage of the power terminal T10 and the voltage of the bonding pad 12, the gates T34A, T35A, and T36A of the PMOS transistors 34-36 have a higher voltage so that the PMOS transistors 34-36 can be in the turned-off state stably.

When the electronic circuit 1 is not in the operation mode, the power T10 is in the floating state without receiving any operation voltage, and the detection voltage V10 is equal to 0V. When an electrostatic discharge event occurs on the bonding pad 12, the voltage of the bonding pad 12 increases instantaneously. At this time, according to the detection voltage V10 (0V) at the detection node N10, the PMOS transistor 31 is turned on to provide a current path between the bonding pad 12 and the output terminal T160. Through this current path, the tracking voltage V16 of the output terminal T160 increases with the voltage of the bonding pad 12 and finally becomes equal to the voltage of the bonding pad 12, thereby achieving that the voltage tracking circuit 16 tracks a voltage with a higher level (that is, the voltage of the bonding pad 12).

Moreover, when an electrostatic discharge event occurs on the bonding pad 12, since the power terminal T10 is in the floating state and the voltage of the bonding pad 12 increases instantaneously, the PMOS transistor 32 is turned on, and the control voltage V30 is equal to the voltage of the bonding pad 12. At this time, even if the voltage-reducing circuit 33 still performs the above-mentioned voltage-reducing operation, the PMOS transistor 30 is turned off because the control voltage V30 increases to a high level with the voltage of the bonding pad 12. Due to the turned-off state of the PMOS transistor 30, even if the tracking voltage V16 is high than the voltage of the power terminal T10, there will be no leakage current from the output terminal T160 to the power terminal T10. Accordingly, the tracking voltage V16 can be stably maintained at the voltage of the bonding pad 12.

According to the above description, when the electronic circuit 1 operates normally, the power terminal T10 receives the operation voltage VDD of, for example, 44V, and the voltage of the bonding pad 12 is within the range of 0V-44V; when the electronic circuit 1 is not in the operation mode, an electrostatic discharge event occurs on the bonding pad 12, which causes the voltage of pad 12 to increase instantaneously. In FIG. 3, the drain T30B of the transistor 30 is coupled to the power terminal T10, and the drain T31B of the transistor 31 and the drain T32B of the transistor 32 are coupled to the bonding pad 12. Based on the circuit structure shown in FIG. 3, since the respective gate-drain withstand voltages of the transistors 30, 31, and 32 are about 40V, the transistor 31-32 may not be damaged by the large voltage difference between the power terminal T10 and the bonding pad 12.

Figure 4:
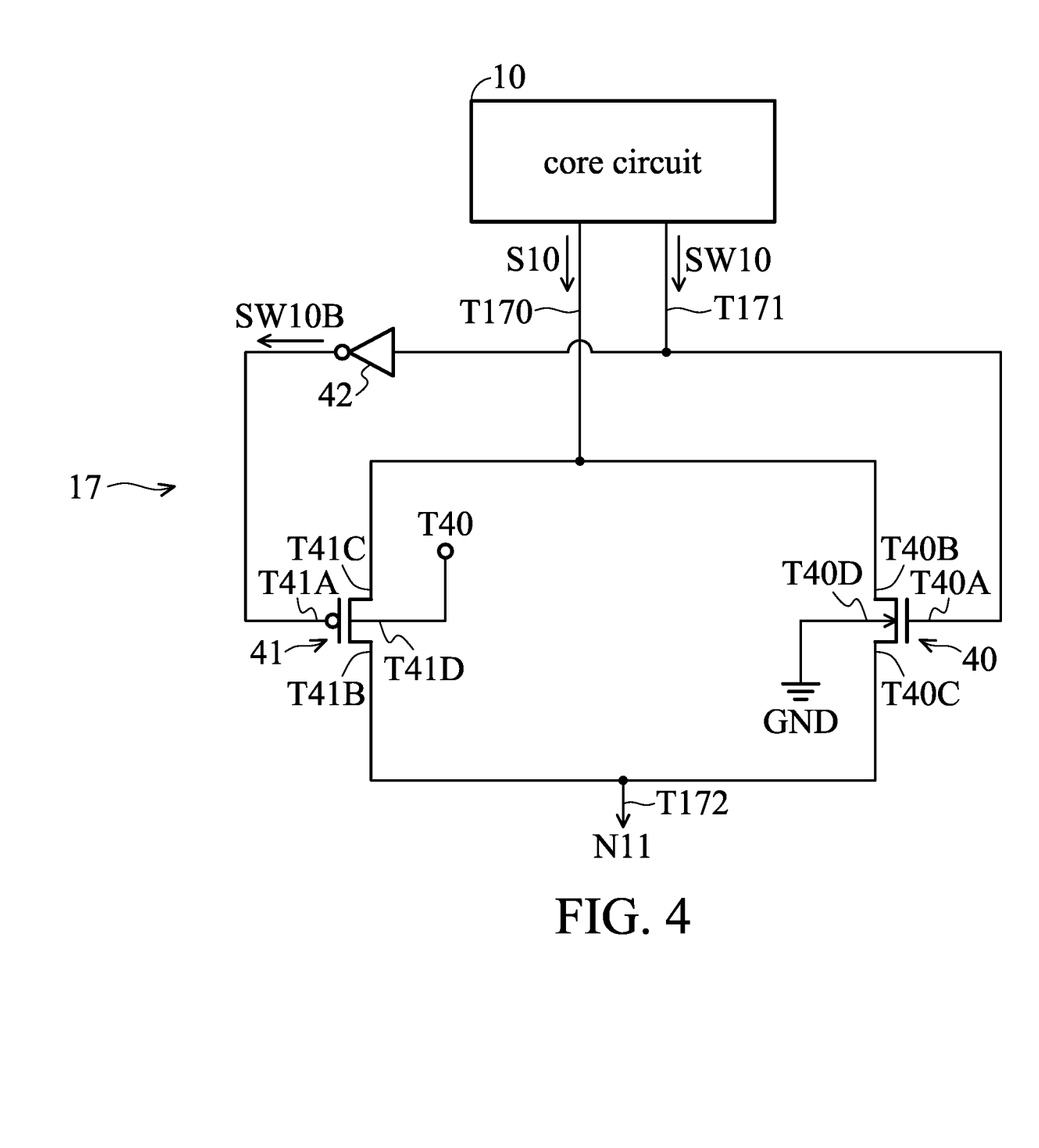
FIG. 4 is schematic diagram showing a transmission gate circuit of the driving circuit in FIG. 1 according to an embodiment of the present invention.

FIG. 4 is schematic diagram showing the transmission gate circuit 17 of the drive circuit 11. In order to clearly describe the structure and operation of the transmission gate circuit 17, FIG. 4 also shows the core circuit 10. Referring to FIG. 4, the transmission gate circuit 17 comprises an NMOS transistor 40, a PMOS transistor 41, and an inverter 42. In the embodiment, the operation voltage level of the input signal S10 and the switching signal SW10 provided by the core circuit 10 are within the range of 0V-5V, and the NMOS transistor 40 and the PMOS transistor 41 are implemented by transistor whose gate-drain withstand voltages of do not exceed 5V.

Referring to FIG. 4, the NMOS transistor 40 comprises four electrode terminals T40A-T40D, which are a gate T40A, a drain T40B, a source T40C, and a bulk T40D respectively. The gate T40A is coupled to the input terminal T171 of the transmission gate circuit 17, the drain T40B is coupled to the input terminal T170 of the transmission gate circuit 17, the source T40C is coupled to the output terminal T172 of the transmission gate circuit 17, and the bulk T40D is coupled to the ground terminal GND. The input terminal of the inverter 42 is coupled to the input terminal T171. The PMOS transistor 41 comprises four electrode terminals T41A-T41D, which are a gate T41A, a drain T41B, a source T41C, and a bulk T41D respectively. The gate T41A is coupled to the output terminal of the inverter 42, the drain T41B is coupled to the input terminal T170, the source T41C is coupled to the output terminal T172, and the bulk T41D is coupled to a power terminal T40. In the embodiment, the power terminal T40 may receive an operation voltage within a range of 0V-5V.

The operation of the transmission gate circuit 17 is explained as following paragraphs.

When the electronic circuit 1 operates normally (that is, the electronic circuit 1 in the operation mode), the core circuit 10 provides the input signal S10 and the switching signal SW10 to the input terminals T170 and T171 respectively, and the power terminal T40 receives an operation voltage. In the operation mode, the switch signal SW10 is at a high voltage level (for example, a level of 5V), and the core circuit 10 sets the input signal S10 on a voltage level within the range of 0V-5V according to the operation of the electronic circuit 1. The inverter 42 receives the switching signal SW10 through the input terminal T171 and inverts the switching signal SW10 to generate a switching signal SW10B having a low voltage level (for example, a level of 0V). The gate T40A of the NMOS transistor 40 receives the high-voltage switching signal SW10 through the input terminal T171, and the gate T41A of the PMOS transistor 41 receives the low-voltage switching signal SW10B from the inverter 42. Therefore, both the NMOS transistor 40 and the NMOS transistor 41 are turned on. The input signal S10 provided by the core circuit 10 is transmitted to the output terminal T172 through the turned-on NMOS transistor 40 and the turned-on NMOS transistor 41, thereby achieving the signal transmission operation of the transmission gate circuit 17. The input signal S10 is then transmitted to the node N10. Accordingly, the level of the driving voltage V11 at the node N11 varies with the voltage level of the input signal S10. The NMOS transistor 150 operates according to the driving voltage V11 and the voltage of the bonding pad 12.

When the electronic circuit 1 is not in the operation mode, the core circuit 10 does not provide the input signal S10 and the switching signal SW10, and the power terminal T40 does not receive any operation voltage. At this time, the power terminal T40, the input terminals T170 and T171, and the output terminal T172 of the transmission gate circuit 17 are in a floating state. Therefore, the transmission gate circuit 17 does not perform the signal transmission operation. In other words, the signal or voltage at the input terminal T170 of the transmission gate circuit 17 will not affect the level of the driving voltage V11 at the node N11.

Figure 5:
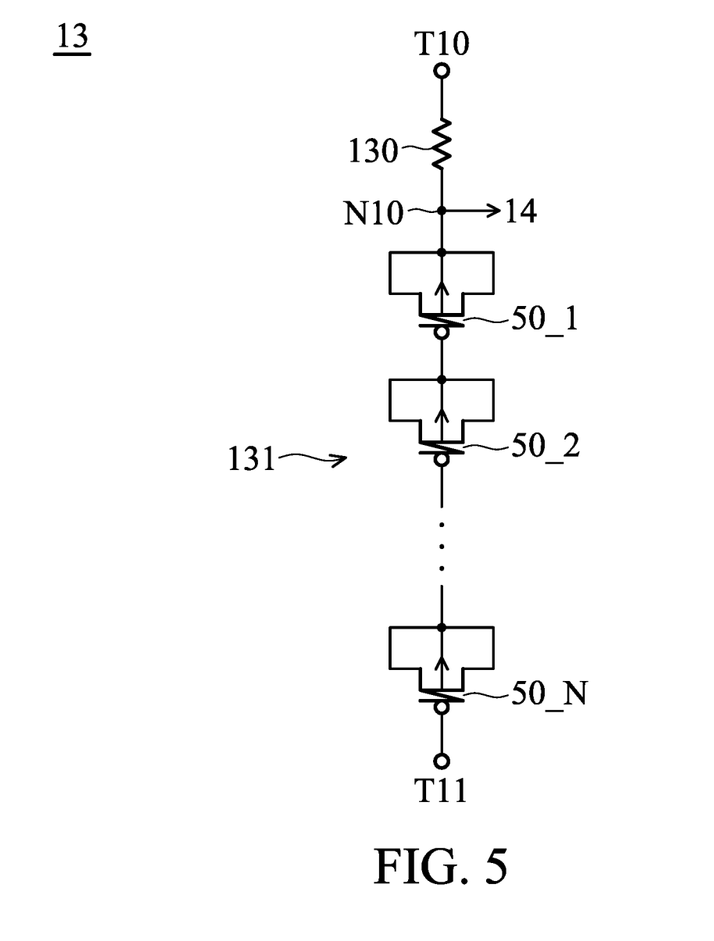
FIG. 5 is schematic diagram showing a detection circuit of the driving circuit in FIG. 1 according to an embodiment of the present invention.

FIG. 5 is schematic diagram showing the detection circuit 13 of the driving circuit 10. The capacitor 131 of the detection circuit 13 is implemented by a plurality of transistors connected in series. As shown in FIG. 5, the capacitor 131 comprises a plurality of PMOS transistors 50_1-50_N, wherein N is an integer greater than or equal to 2. In the embodiment, the PMOS transistors 50_1-50_N can be implemented by MOS transistors with a gate-drain withstand voltage of 5V. In the example where the NMOS transistors 140, 141, and 150 are LDMOS transistors and the operation voltage VDD is 44V, N can be equal to, for example, 9. That is, the capacitor 131 comprises nine PMOS transistors 50_1-50_9, however the present invention is not limited thereto.

Referring to FIG. 5, the PMOS transistors 50_1-50_N are sequentially connected in series between the detection node N10 and the power terminal T11. For each of the PMOS transistors 50_1-50_N, the drain, source, and bulk are coupled to each other so that the PMOS transistor is equivalent to a capacitor. The drain, source, and bulk of the PMOS transistor 50_1 are coupled to the detection node N10. The drain, source, and bulk of each of the PMOS transistors 50_2-50_N are coupled to the gate of the previous PMOS transistor. The gate of the PMOS transistor 50_N is coupled to the power terminal T11.

Figure 6:
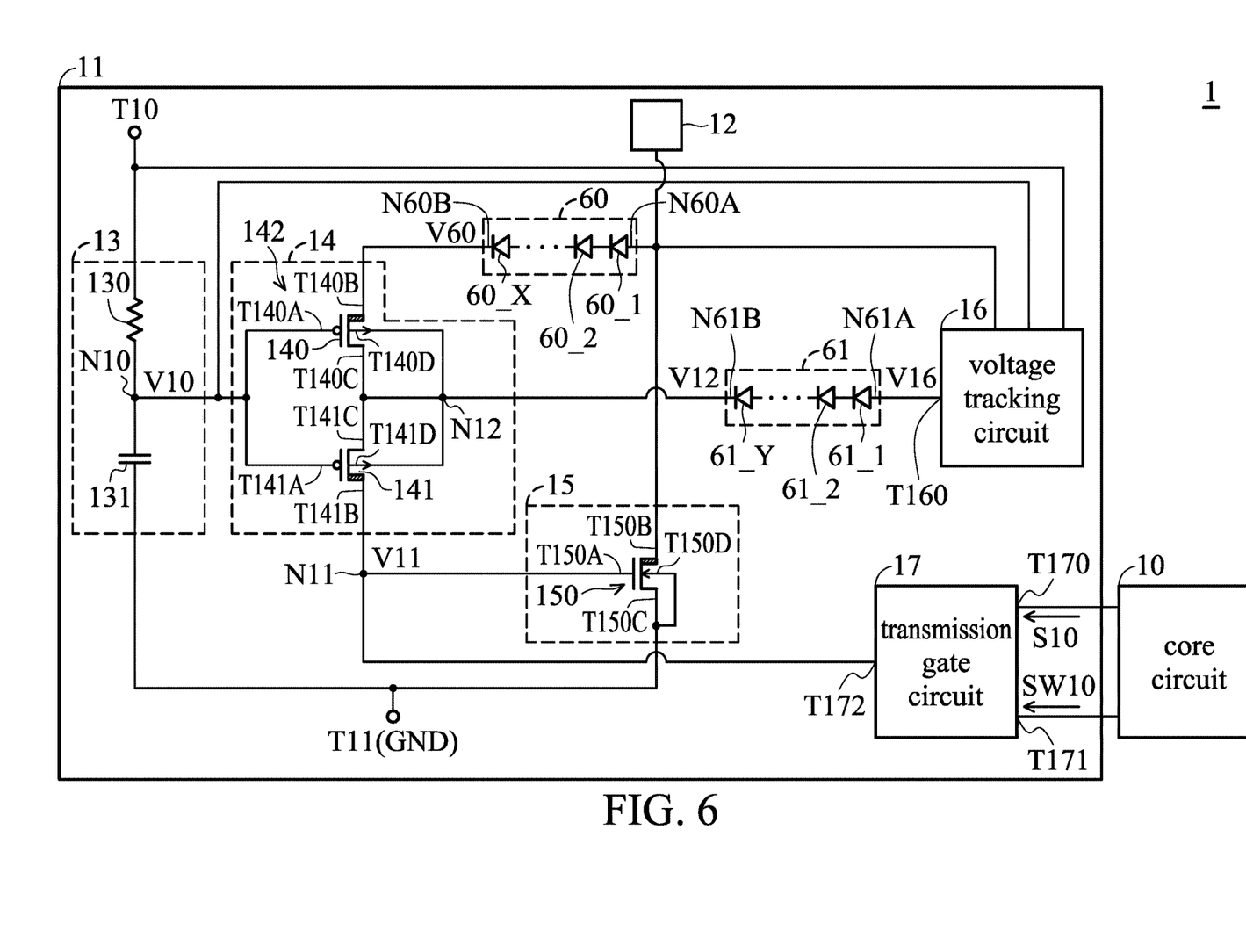
FIG. 6 shows an electronic circuit comprising a driver circuit according to another embodiment of the present invention.

FIG. 6 shows an electronic circuit comprising a driver circuit according to another embodiment of the present invention. Referring to FIG. 6, the driver circuit 11 further comprises voltage-reducing circuits 60 and 61. The voltage-reducing circuit 60 is coupled between the bonding pad 12 and the transistor device 142 and provides a modulation voltage. The voltage-reducing circuit 60 reduces the voltage of the bonding pad 12 by the amount of the modulation voltage to generate the input voltage V60 and provides the input voltage V60 to the transistor device 142.

The voltage-reducing circuit 60 comprises an input node N60A, an output node N60B, and a plurality of voltage-reducing elements connected in series between the input node N60A and the output node N60B. The input node N60A is coupled to the bonding pad 12, and the output node N60B is coupled to the drain T140B of the PMOS transistor 140 of the transistor device 142. In the embodiment, the voltage-reducing circuit 60 comprises diodes 60_1-60_X sequentially connected in series between the input node N60A and the output node N60B as the voltage-reducing elements, wherein X is an integer greater than or equal to 1. The actual number of voltage-reducing elements can be adjusted according to the actual acquirements for the modulation voltage provided by the voltage-reducing circuit 60. The anode of the diode 60_1 is coupled to the input node N60A. The anode of each of the diodes 60_2-60_X is coupled to the cathode of the previous diode. The cathode of the diode 60_X is coupled to the output node N60B.

Each of the diodes 60_1-60_X provides a cross-voltage of 0.7V between the respective anode and cathode. Therefore, the voltage difference between the input node N60A and the output node N60B of the voltage-reducing circuit 60 is equal to 0.7×X. The voltage difference between the input node N60A and the output node N60B serves as the modulation voltage provided by the voltage-reducing circuit 60. The voltage-reducing circuit 60 reduces the voltage of the bonding pad 12 by the amount of the modulation voltage to generate the input voltage V60.

According to the above description, the voltage-reducing circuit 60 is coupled between the bonding pad 12 and the transistor device 142 and performs the voltage-reducing operation. When there is a large voltage on the bonding pad 12, the input voltage V60 generated based on the voltage-reducing operation is less than the voltage of the bonding pad 12, so as to prevent the transistor device 142 from being damaged by the large voltage of the bonding pad 12.

The voltage-reducing circuit 61 is coupled between the voltage tracking circuit 16 and the common source node N12 and provides a modulation voltage. In the embodiment of FIG. 1, the tracking voltage V16 is applied to the common source node N12 to serve as the bias voltage V12, in other words, the bias voltage V12 is equal to the tracking voltage V16. In the embodiment of FIG. 6, the voltage-reducing circuit 61 reduces the tracking voltage V16 by the amount of the modulation voltage provided by the voltage-reducing circuit 61 to generate the bias voltage V12 and provides the bias voltage V12 to the common source node N12.

The voltage-reducing circuit 61 comprises an input node N61A, an output node N61B, and a plurality of voltage-reducing elements connected in series between the input node N61A and the output node N61B. The input node N61A is coupled to the voltage tracking circuit 16 to receive the tracking voltage V16, and the output node N61B is coupled to the common source node N12. In the embodiment, the voltage-reducing circuit 61 comprises diodes 61_1-61_Y serially connected between the input node N61A and the output node N61B as the voltage-reducing elements, wherein Y is an integer greater than or equal to 1. The actual number of voltage-reducing elements can be adjusted according to the actual acquirements for the modulation voltage provided by the voltage-reducing circuit 61. The anode of the diode 61_1 is coupled to the input node N61A. The anode of each of the diodes 61_2-61_Y is coupled to the cathode of the previous diode. The cathode of the diode 61_Y is coupled to the output node N61B.

Each of the diodes 61_1-61_Y provides a cross-voltage of 0.7V between the respective anode and cathode. Therefore, the voltage difference between the input node N61A and the output node N61B of the voltage-reducing circuit 61 is equal to 0.7×Y. The voltage difference between the input node N61A and the output node N61B serves as the modulation voltage provided by the voltage-reducing circuit 61. The voltage-reducing circuit 61 reduces the tracking voltage V16 by the amount of the modulation voltage to generate the bias voltage V12.

According to the above description, the voltage-reducing circuit 61 is coupled between the voltage tracking circuit 16 and the common source node N12 and performs the voltage-reducing operation. When the tracking voltage V16 generated by the tracking operation of the voltage tracking circuit 16 is a large voltage, the bias voltage V12 generated based on the voltage-reducing operation is less than the tracking voltage V16, so as to prevent the common source node N12 of the transistor device 142 from being damaged by the large voltage.

In the embodiment of FIG. 6, the number of diodes 60_1-60_X of the voltage-reducing circuit 60 is equal to the number of diodes 61_1-61_Y of the voltage-reducing circuit 61, that is, X=Y. In other embodiments, according to the requirements of the specification of the electronic circuit 1, the number of diodes 60_1-60_X is not equal to the number of diodes 61_1-61_Y. For example, the number of diodes 60_1-60_X is greater than the number of diodes 61_1-61_Y, that is X>Y.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit comprising:
   a detection circuit, coupled between a first power terminal and a second power terminal, generating a detection voltage at a detection node based on a first voltage of the first power terminal and a second voltage of the second power terminal;
   a control circuit comprising a transistor device with a back-to-back connection structure, wherein the transistor device is coupled between a bonding pad and a first node and controlled by the detection voltage, wherein a driving voltage is generated at the first node; and
   a power device, coupled between the bonding pad and the second power terminal, controlled by the driving voltage,
   wherein in response to an electrostatic discharge event occurring on the bonding pad, the transistor device is turned on according to the detection voltage, and the power device is triggered by the driving voltage to provide a discharge path between the bonding pad and the second power terminal;
   wherein the transistor device with the back-to-back connection structure comprises two P-type transistors coupled in series.

2. The driving circuit as claimed in claim 1, wherein the transistor device with the back-to-back connection structure the two P-type transistors coupled in series comprises:
   a first P-type transistor having a gate coupled to the detection node, a drain coupled to the bonding pad, and a source; and
   a second P-type transistor having a gate coupled to the detection node, a source coupled to the source of the first P-type transistor, and a drain coupled to the first node.

3. The driving circuit as claimed in claim 2, wherein the first P-type transistor and the second P-type transistor are implemented by laterally-diffused metal-oxide semiconductor (LDMOS) transistors.

4. The driving circuit as claimed in claim 1, wherein the power device is implemented by a large array device (LAD).

5. The driving circuit as claimed in claim 4, wherein the large array device comprises a plurality of laterally-diffused N-type metal-oxide semiconductor large array device (LDNMOS) transistors.

6. The driving circuit as claimed in claim 1, wherein the control circuit comprises:
   a voltage-reducing circuit, coupled between the bonding pad and the transistor device, providing a modulation voltage, wherein the voltage-reducing circuit reduces a voltage of the bonding pad by the amount of the modulation voltage to generate an input voltage and provides the input voltage to the transistor device.

7. The driving circuit as claimed in claim 6, wherein the voltage-reducing circuit comprises:
   an input node coupled to the bonding pad;
   an output node coupled to the transistor device; and
   a plurality of voltage-reducing elements connected in series between the input node and the output node,
   wherein the modulation voltage is a voltage difference between the input node and the output node.

8. The driving circuit as claimed in claim 1, wherein the control circuit further comprises:
   a first voltage-reducing circuit, coupled to a common source node of the back-to-back connection structure, receiving a tracking voltage and providing a first modulation voltage, wherein the first voltage-reducing circuit reduces the tracking voltage by the amount of the first modulation voltage to generate a bias voltage and provides the bias voltage to the common source node,
   wherein the tracking voltage is equal to the first voltage of the first power terminal or a voltage of the bonding pad.

9. The driving circuit as claimed in claim 8, wherein the first voltage-reducing circuit comprises:
   a first input node receiving the tracking voltage;
   a first output node coupled to the common source node of the back-to-back connection structure; and
   a plurality of first voltage-reducing elements connected in series between the first input node and the first output node,
   wherein the first modulation voltage is a voltage difference between the first input node and the first output node.

10. The driving circuit as claimed in claim 8, further comprising:
    a voltage tracking circuit, coupled to the first power terminal and the bonding pad, tracking the first voltage of the first power terminal or the voltage of the bonding pad to generate the tracking voltage and applying the tracking voltage to the first voltage-reducing circuit.

11. The driving circuit as claimed in claim 10, wherein the voltage tracking circuit comprises:
    a first P-type transistor having a gate, a drain coupled to the first power terminal, and a source;
    a second P-type transistor having a gate coupled to the detection node, a drain coupled to the bonding pad, and a source;
    a third P-type transistor having a gate coupled to the first power terminal, a drain coupled to the bonding pad, and a source, wherein the source of the third P-type transistor is coupled to the gate of the first P-type transistor at a second node; and
    a second voltage-reducing circuit, coupled between the first power terminal and the second node, providing a second modulation voltage,
    wherein the source of the first P-type transistor and the source of the second P-type transistor are coupled to an output terminal of the voltage tracking circuit, and the tracking voltage is generated at the output terminal.

12. The driving circuit as claimed in claim 11, wherein in response to the first voltage of the first power terminal being higher than or equal to the voltage of the bonding pad, the second voltage-reducing circuit reduces the first voltage of the first power terminal by the amount of the second modulation voltage to determine a control voltage at the second node, and the first P-type transistor is turned on according to the control voltage such that the tracking voltage is equal to the first voltage.

13. The driving circuit as claimed in claim 11, wherein in response to the first voltage of the first power terminal being lower than the voltage of the bonding pad, the second P-type transistor is turned on, and the tracking voltage is equal to the voltage of the bonding pad.

14. The driving circuit as claimed in claim 13, wherein in response to the first voltage of the first power terminal being lower than the voltage of the bonding pad, the third P-type transistor is turned on, and the control voltage is determined according to the voltage of the bonding pad to turn off the first P-type transistor.

15. The driving circuit as claimed in claim 11, wherein the second voltage-reducing circuit comprises:
- a first input node coupled to the first power terminal;
- a first output node coupled to the first P-type transistor at the second node; and
- a plurality of first voltage-reducing elements connected in series between the first input node and the first output node,
- wherein the second regulation voltage is a voltage difference between the first input node and the first output node.

16. The driving circuit as claimed in claim 11, wherein the first P-type transistor, the second P-type transistor, and the third P-type transistor are implemented by laterally-diffused metal-oxide semiconductor (LDMOS) transistors.

17. The driving circuit as claimed in claim 1, further comprising:
- a voltage tracking circuit, coupled to the first power terminal and the bonding pad, tracking the first voltage of the first power terminal or the voltage of the bonding pad to generate the tracking voltage and applying the tracking voltage to a common source node of the back-to-back connection structure.

18. The driving circuit as claimed in claim 1, further comprising:
- a transmission gate circuit having an input terminal and an output terminal coupled to the first node and controlled by a first switching signal;
- wherein in response to the first power terminal receiving an operation voltage as the first voltage, the input terminal of the transmission gate circuit receives an input signal and transmits the input signal to the output terminal according to the first switching signal.

19. The driving circuit as claimed in claim 18, wherein the transmission gate circuit comprises:
- an N-type transistor having a gate receiving the first switching signal, a drain coupled to the input terminal, and a source coupled to the output terminal; and
- a P-type transistor having a gate receiving a second switching signal, a source coupled to the input terminal, and a drain coupled to the output terminal,
- wherein the second switching signal is inverse to the first switching signal.

20. The driving circuit as claimed in claim 1, wherein the detection circuit comprises:
- a resistor coupled between the first power terminal and the detection node; and
- a capacitor coupled between the detection node and the second power terminal.

\* \* \* \* \*